United States Patent
Bourim et al.

(10) Patent No.: US 8,525,142 B2
(45) Date of Patent: Sep. 3, 2013

(54) NON-VOLATILE VARIABLE RESISTANCE MEMORY DEVICE AND METHOD OF FABRICATING THE SAME

(75) Inventors: El Mostafa Bourim, Yongin-si (KR); Eun-Hong Lee, Anyang-si (KR); Choong-Rae Cho, Gimhae-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 117 days.

(21) Appl. No.: 11/797,519

(22) Filed: May 4, 2007

(65) Prior Publication Data
US 2007/0290186 A1 Dec. 20, 2007

(30) Foreign Application Priority Data
May 4, 2006 (KR) .................. 10-2006-0040389

(51) Int. Cl.
*H01L 29/02* (2006.01)
(52) U.S. Cl.
USPC ...................................... 257/2; 257/E21.613
(58) Field of Classification Search
USPC .............................. 257/1, 2–5; 365/129–180
See application file for complete search history.

(56) References Cited

U.S. PATENT DOCUMENTS

| 5,709,958 | A | 1/1998 | Toyoda et al. |
| 6,034,882 | A | 3/2000 | Johnson et al. |
| 6,185,122 | B1 | 2/2001 | Johnson et al. |
| 6,724,580 | B2 | 4/2004 | Irie et al. |
| 6,781,172 | B2 | 8/2004 | Moriya et al. |
| 6,870,755 | B2 | 3/2005 | Rinerson et al. |
| 6,872,963 | B2 | 3/2005 | Kostylev et al. |
| 6,891,749 | B2 | 5/2005 | Campbell et al. |
| 7,029,924 | B2 * | 4/2006 | Hsu et al. ........................... 438/3 |
| 7,521,704 | B2 | 4/2009 | Lee et al. |
| 7,538,338 | B2 * | 5/2009 | Rinerson et al. ................. 257/4 |
| 2004/0159868 | A1 * | 8/2004 | Rinerson et al. .............. 257/295 |
| 2004/0245557 | A1 | 12/2004 | Seo et al. |
| 2004/0256697 | A1 * | 12/2004 | Jang ............................ 257/578 |
| 2005/0052915 | A1 | 3/2005 | Herner et al. |
| 2005/0110117 | A1 | 5/2005 | Hsu |
| 2005/0145910 | A1 | 7/2005 | Tamai et al. |
| 2005/0146955 | A1 | 7/2005 | Kajiyama |

(Continued)

FOREIGN PATENT DOCUMENTS

| CN | 1574363 | 2/2005 |
| CN | 1652336 | 8/2005 |

(Continued)

OTHER PUBLICATIONS

English Translation of Chinese Office Action dated Jul. 31, 2009 in corresponding Chinese Application No. 200610159882.1.

(Continued)

*Primary Examiner* — Matthew W Such
*Assistant Examiner* — Ali Naraghi
(74) *Attorney, Agent, or Firm* — Harness, Dickey & Pierce, P.L.C.

(57) ABSTRACT

A non-volatile variable resistance memory device and a method of fabricating the same are provided. The non-volatile variable resistance memory device may include a lower electrode, a buffer layer on the lower electrode, an oxide layer on the buffer layer and an upper electrode on the oxide layer. The buffer layer may be composed of an oxide and the oxide layer may have variable resistance characteristics.

12 Claims, 9 Drawing Sheets

(56) References Cited

U.S. PATENT DOCUMENTS

| | | |
|---|---|---|
| 2005/0161726 A1 | 7/2005 | Shin et al. |
| 2005/0174872 A1 | 8/2005 | Rinerson et al. |
| 2005/0194622 A1 | 9/2005 | Lee et al. |
| 2005/0266686 A1 | 12/2005 | Zhuang et al. |
| 2006/0038221 A1 | 2/2006 | Lee et al. |
| 2006/0098472 A1 | 5/2006 | Ahn et al. |
| 2006/0109704 A1 | 5/2006 | Seo et al. |
| 2006/0120205 A1 | 6/2006 | Odagawa et al. |
| 2006/0289942 A1 | 12/2006 | Horii et al. |
| 2007/0012905 A1* | 1/2007 | Huang ............................ 257/2 |
| 2007/0014149 A1 | 1/2007 | Nagamine et al. |
| 2007/0051998 A1* | 3/2007 | Kil et al. ........................ 257/310 |
| 2007/0069241 A1 | 3/2007 | Yang et al. |
| 2007/0114508 A1* | 5/2007 | Herner et al. .................... 257/2 |
| 2007/0120580 A1 | 5/2007 | Kim et al. |
| 2007/0228354 A1* | 10/2007 | Scheuerlein ...................... 257/3 |
| 2007/0290186 A1 | 12/2007 | Bourim et al. |
| 2007/0290214 A1 | 12/2007 | Ku et al. |
| 2008/0116438 A1 | 5/2008 | Lee et al. |
| 2008/0121865 A1 | 5/2008 | Ahn et al. |

FOREIGN PATENT DOCUMENTS

| | | |
|---|---|---|
| CN | 1790726 | 6/2006 |
| EP | 1 657 753 | 5/2006 |
| JP | 2005-123361 A | 5/2005 |
| JP | 2005-159359 A | 6/2005 |
| JP | 2006/019444 A | 1/2006 |
| KR | 10-2005-0080662 | 8/2005 |
| KR | 10-0552704 B1 | 2/2006 |
| KR | 10-2006-0018879 | 3/2006 |
| KR | 10-0657897 B1 | 12/2006 |
| KR | 10-0682895 B1 | 2/2007 |
| KR | 10-0773537 B1 | 11/2007 |
| KR | 10-1051704 B1 | 7/2011 |

OTHER PUBLICATIONS

Korean Office action dated Feb. 27, 2008 in corresponding Korean Application No. 10-2007-0052918.

European Search Report dated Oct. 23, 2008 in corresponding European Application No. 08157323.0-2222.

Office Action dated Aug. 30, 2010 for corresponding Chinese Patent Application No. 200810108832.X with English translation.

European Office Action dated Jul. 13, 2010 in corresponding European Application No. 08157323.0-2222.

Myoung-Jae Lee et al.; Adv. Mater., vol. 19, pp. 73-76 (2007).

Ranju Jung et al.; Applied Physics Letters, vol. 91 (2); 022112-1-022112-3, (2007).

Chinese Office Action with English translation dated Dec. 31, 2010 for corresponding Chinese Patent Application No. 200710192709.6.

Chinese Office Action dated Nov. 6, 2009 in corresponding Chinese Application No. 200710192709.6.

Korean Office Action mailed Mar. 22, 2012 in corresponding Korean Application No. 10-2006-0113385.

Korean Office Action mailed Apr. 23, 2012 in corresponding Korean Application No. 10-2006-0040389.

J.R. Waldrop, "Electrical properties of ideal metal contacts to GaAs: Schottky-barrier height," *J. Vac. Sci. Technol B*, vol. 2, No. 3, pp. 445-448 (Jul.-Sep. 1984).

M. Schulze, et al., "Reaction of potassium with thin epitaxial NiO(100) films," *Surface Science*, vol. 507-510, pp. 851-858 (Jun. 2002).

H.W. Jang, et al., "Low-resistant and high-transparent Ru/Ni ohmic contact on p-type GaN," *Appl. Phys. Lett.*, vol. 80, No. 16, pp. 2937-2939 (2002).

\* cited by examiner

NON-VOLATILE VARIABLE RESISTANCE MEMORY DEVICE AND METHOD OF FABRICATING THE SAME

PRIORITY STATEMENT

This application claims priority under 35 U.S.C. §119 to Korean Patent Application No. 10-2006-0040389, filed on May 4, 2006, in the Korean Intellectual Property Office (KIPO), the entire contents of which are incorporated herein by reference.

BACKGROUND

1. Field

Example embodiments relate to a non-volatile variable resistance memory device and a method of fabricating the same. Other example embodiments relate to a non-volatile variable resistance memory device employing a buffer layer on a lower electrode of the memory device including a transition metal oxide having variable resistance characteristics, thereby to result in a decrease of a reset current and a method of fabricating the same.

2. Description of the Related Art

Much effort has been made to develop semiconductor devices that have an increased number of memory cells per unit area, for example, an increased integration density and may be operated at relatively high speed and with relatively low power consumption. A semiconductor memory device may include a large number of memory cells connected by circuits. In a dynamic random access memory (DRAM) used as a typical semiconductor memory device, a unit memory cell normally may include one switch and one capacitor. The DRAM may have advantages of relatively high integration density and relatively high operating speed, but when the power supply is shut down, it may lose all its stored data.

In a non-volatile memory device (e.g., a flash memory device), all stored data may be maintained even when the power is cut off. Unlike a volatile memory, the flash memory may have characteristics of non-volatility, but it may have a relatively low integration density and a relatively low operating speed compared to those of the DRAM. Non-volatile memory devices, which are currently the subject of much study, may include a magnetic random access memory (MRAM), a ferroelectric random access memory (FRAM), a phase-change random access memory (PRAM) and/or a resistance random access memory (RRAM). The non-volatile memory device (e.g., the RRAM described above) may use the resistance of a transition metal oxide that may vary in accordance with a voltage applied to the transition metal oxide (variable resistance characteristics).

FIG. 1A illustrates a typical structure of a variable resistance RAM (RRAM). An RRAM using a transition metal oxide (TMO) as a variable resistance material may have switching characteristics that enable it to be used as a memory device.

Referring to FIG. 1A, a lower electrode 10, an oxide layer 12, and an upper electrode 14 may be formed. The lower electrode 10 and the upper electrode 14 may be composed of a conductive material, for example, metal, and the oxide layer 12 may be composed of a transition metal oxide having variable resistance characteristics. Particular examples of transition metal oxide may include ZnO, $TiO_2$, $Nb_2O_5$, $ZrO_2$ and/or NiO.

FIG. 1B is a graphical representation illustrating operating characteristics of the conventional non-volatile variable resistance memory device shown in FIG. 1A. A lower electrode may be composed of Ru with a thickness of about 20 nm, and an oxide layer may be formed on the lower electrode. The oxide layer may be composed of NiO with a thickness of about 50 nm. An upper electrode may be formed on the oxide layer and the upper electrode may be composed of Ru with a thickness of about 20 nm. A voltage may be applied and the current may be measured.

Referring to FIG. 1B, when a voltage of about 0.7 V is applied in a first switching cycle, a reset current may be about 3 mA. When about 50 cycles of a switching operation have been performed, a reset current may be increased to about 50 mA. When the switching operation is repeatedly performed, the resistance state of the oxide layer 12 may be continuously changed. Operation voltage may be increased and reset voltage may be increased, which causes the reliability of the memory device to decrease. A memory device with a structure having relatively stable operating characteristics may need to be developed.

SUMMARY

Example embodiments provide a non-volatile variable resistance memory device capable of showing relatively stable reset currents in spite of repeated switching operation, by employing a buffer layer between a lower electrode and an oxide layer and a method of fabricating the same.

According to example embodiments, a non-volatile variable resistance memory device may include a variable resistance material, and the memory device may include a lower electrode, a buffer layer on the lower electrode, an oxide layer on the buffer layer and an upper electrode on the oxide layer.

According to example embodiments, a method of fabricating a non-volatile variable resistance memory device may include a variable resistance material and the method may include forming a buffer layer on a lower electrode, forming an oxide layer on the buffer layer and forming an upper electrode on the oxide layer.

The buffer layer may be composed of an oxide. The oxide layer may have variable resistance characteristics. A work function of the buffer layer may be higher than that of the lower electrode. A work function of the upper electrode may be higher than that of the oxide layer. The lower electrode may be composed of a material having a work function lower than about 5.0 eV. The lower electrode may be composed of W, Ta, Cu, Hf, Mo, Sr, Ag, In and/or Cr. The buffer layer may be composed of a material having a work function higher than about 5.0 eV.

The buffer layer may be composed of Ru oxide, Ir oxide, Cu oxide, Mn oxide and/or Ta oxide. The oxide layer may be composed of a p-type transition metal oxide having variable resistance characteristics. The oxide layer may be composed of Ni oxide and/or Cu oxide. The upper electrode may be composed of a material selected from Ru, Rh, Co, Pd, Ni, Re, Pt, Ru—Ta alloy, Pt—Hf alloy, Pt—Ti alloy, Co—Ni alloy, Ni—Ta alloy and/or an alloy of these materials.

BRIEF DESCRIPTION OF THE DRAWINGS

Example embodiments will be more clearly understood from the following detailed description taken in conjunction with the accompanying drawings. FIGS. 1A-5C represent non-limiting, example embodiments as described herein.

FIG. 1A is a diagram illustrating a conventional non-volatile variable resistance memory device;

FIG. 2 is a diagram illustrating a variable resistance memory device having a buffer layer formed on a lower electrode according to example embodiments;

FIG. 3 is a plot illustrating voltage-current (V-I) characteristics to explain the operating principle of the variable resistance memory device;

FIGS. 5B and 5C are plots illustrating currents and resistances in a variable resistance memory device having a buffer layer formed on a W lower electrode in accordance with switching cycles according to example embodiments.

DETAILED DESCRIPTION OF EXAMPLE EMBODIMENTS

Figure 1A:
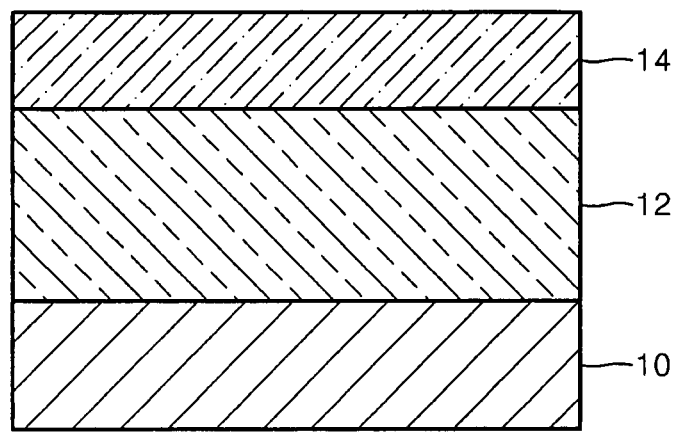

Hereinafter, a variable resistance memory device according to example embodiments will be explained in detail with reference to the accompanying drawings. In the drawings, the thicknesses of layers and regions are exaggerated for clarity.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
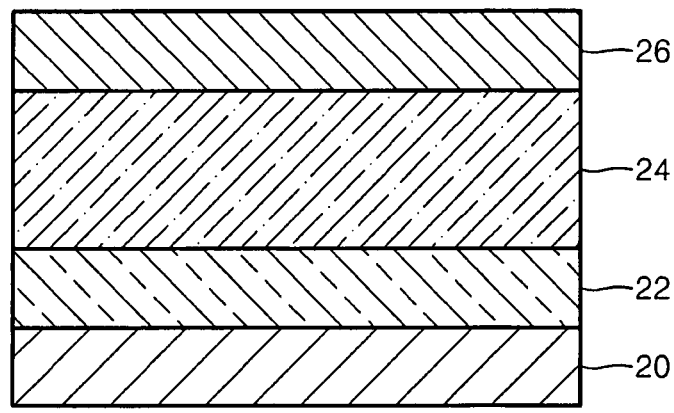

FIG. 2 is a diagram illustrating a variable resistance memory device according to example embodiments. Referring to FIG. 2, the variable resistance memory device according to example embodiments may include a lower electrode 20, and a buffer layer 22, an oxide layer 24, and an upper electrode 26 sequentially formed on the lower electrode. The lower electrode 20 may be composed of a material having a work function lower than about 5.0 eV (e.g., W, Ta, Cu, Hf, Mo, Sr, Ag, In and/or Cr). The buffer layer 22 may be composed of an n-type oxide having a work function higher than that of the lower electrode 20, for example, Ru oxide, Ir oxide, Cu oxide, Mn oxide and/or Ta oxide. A Schottky junction and/or an ohmic contact may be formed at the junction interface between the metal and the n-type semiconductor material. When the buffer layer 22 is composed of an n-type oxide having a work function higher than that of the lower electrode 20, an ohmic contact structure may be formed between the lower electrode 20 and the buffer layer 22.

The oxide layer 24 may be composed of a transition metal oxide having variable resistance characteristics, for example, a p-type oxide (e.g., Ni oxide and/or Cu oxide). The upper electrode 26 may be composed of a material having a work function higher than that of the oxide layer 24. For example, when the oxide layer 24 is composed of NiO, because NiO has about 4.2 eV of a work function, the upper electrode 26 may be composed of a material having a work function higher than about 4.2 eV. For example, the upper electrode 26 may be composed of a material selected from Ru, Rh, Co, Pd, Ni, Re, Pt, Ru—Ta alloy, Pt—Hf alloy, Pt—Ti alloy, Co—Ni alloy, Ni—Ta alloy and/or an alloy of these materials. A Schottky junction and/or an ohmic contact may be formed at the junction interface between the metal and the p-type semiconductor material. As described above, when the upper electrode 26 has a work function higher than that of the oxide layer 24, an ohmic contact structure may be formed between the upper electrode 26 and the oxide layer 24.

The variable resistance memory device according to example embodiments may be characterized in that an ohmic contact structure may be formed between the lower electrode 20 and the buffer layer 22, and between the oxide layer 24 and the upper electrode 26. As the buffer layer 22 is composed of an n-type oxide and the oxide layer 24 is composed of a p-type oxide, the variable resistance memory device of example embodiments may include a diode structure.

FIG. 2 illustrates only the unit device of the variable resistance memory device according to example embodiments, but in application, a plurality of the lower electrodes 20 may be formed in a first direction, and a plurality of the upper electrodes 26 may be formed in a second direction crossing the first direction, and the buffer layer 22 and the oxide layer 24 may be formed at portions where the lower electrode 20 and the upper electrode 26 cross each other, thereby forming a cross-point type structure. Because a separate switching device is not necessary, integration density may be improved. As described above, the non-volatile memory device including a variable resistance material according to example embodiments may be more easily fabricated using PVD, atomic layer deposition (ALD) and/or CVD processes using sputtering.

Figure 3:
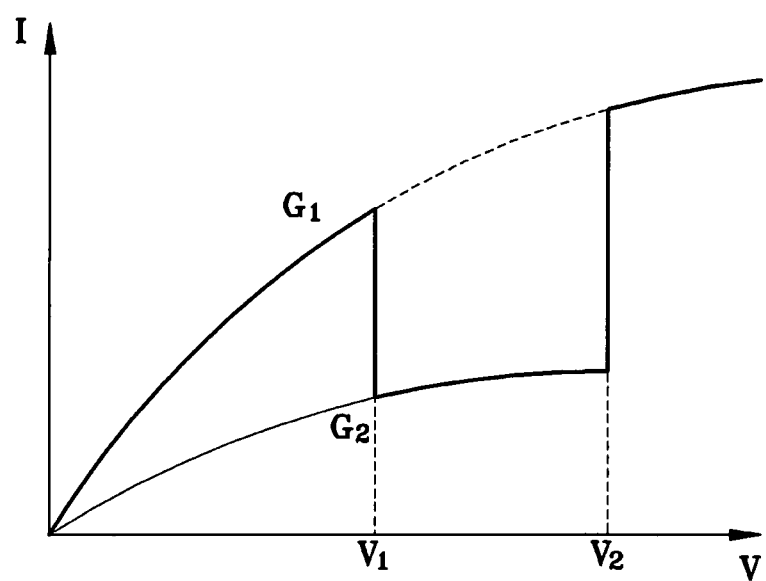

FIG. 3 is a graphical representation illustrating the operating principle of the variable resistance memory device. In FIG. 3, the horizontal axis represents voltages applied between the lower electrode 20 and the upper electrode 26 of the variable resistance memory device, and the vertical axis represents currents flowing through the oxide layer 24. Referring to FIG. 3, when a voltage is gradually increased from about 0 V, a current may be increased in proportion to the applied voltage along a plot $G_1$. When a voltage $V_1$ or higher is applied, current may be decreased due to a sudden increase of resistance. When a voltage in a range of $V_1$ to $V_2$ is applied, current may be increased along a plot $G_2$. When a voltage $V_2$ or higher ($V_2 > V_1$) is applied, current may be increased due to a sudden decrease in resistance and the current follows a plot $G_1$. The state of the plot $G_1$ may be defined as "on" and the state of the plot $G_2$ may be defined as "off". The voltage $V_1$ may be defined as a set voltage, and the voltage $V_2$ may be defined as a reset voltage.

The electrical characteristics of the memory device, when a voltage higher than $V_1$ may be applied, may influence the electrical characteristics displayed when a voltage lower than $V_1$ is applied, which will be explained below in detail. After a voltage in a range of $V_1$ to $V_2$ is applied to the memory device, when a voltage lower than $V_1$ is applied again, a measured current may follow the current along the plot $G_2$. After a voltage higher than $V_2$ is applied to the memory device, and when a voltage lower than $V_1$ is applied again, a measured current may follow the current along the plot $G_1$ of FIG. 3 ($V_3$ is not shown in FIG. 3). The electrical characteristics of the memory device may be influenced by an applied voltage that may be higher than $V_1$ (in a range of $V_1 \sim V_2$ or higher than $V_2$). From the above result, a multi-layer structure showing resistance variation may be employed by the non-volatile memory device using the transition metal oxide. For example, the state of the memory device may be defined as "0" when a voltage in a range of $V_1 \sim V_2$ of FIG. 3 is applied, and the state of the memory device may be defined as "1" when a voltage higher than $V_2$ is applied so as to record data. When reading data, a voltage lower than $V_1$ may be applied to measure the current flowing through the oxide layer, so as to detect whether data recorded in the memory device is in state "0" or "1". Designation of the states "1" and "0" may be selectively determined.

Figure 1B:
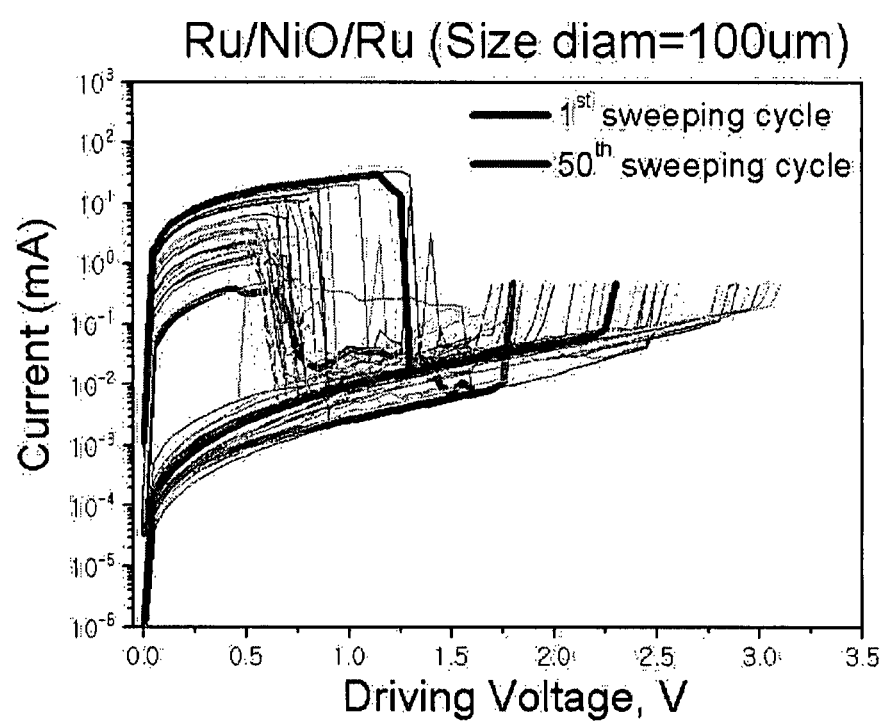
FIG. 1B is a graphical representation illustrating operating characteristics of the conventional non-volatile variable resistance memory device.
Figure 4A:
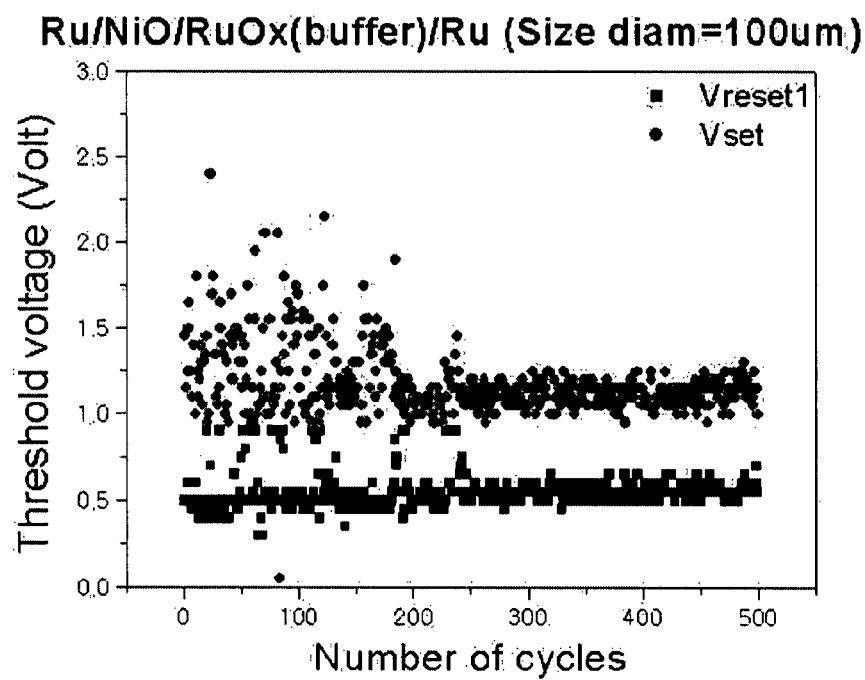
FIG. 4A is a plot illustrating threshold voltages in a variable resistance memory device having a buffer layer formed on a Ru lower electrode in accordance with switching cycles according to example embodiments.
Figure 4B:
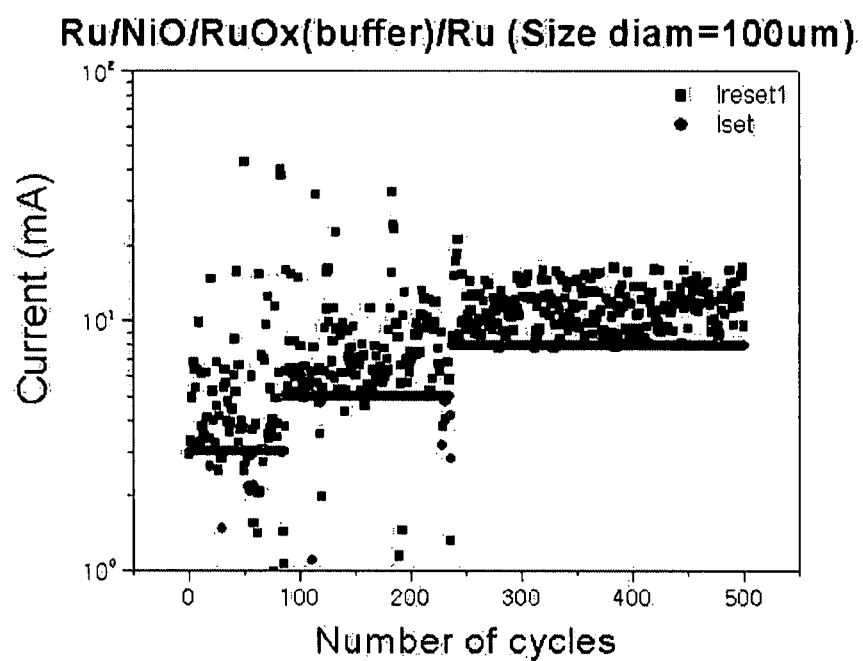
FIGS. 4B and 4C are plots illustrating currents and resistances in a variable resistance memory device having a buffer layer formed on a Ru lower electrode in accordance with switching cycles according to example embodiments.
Figure 4C:
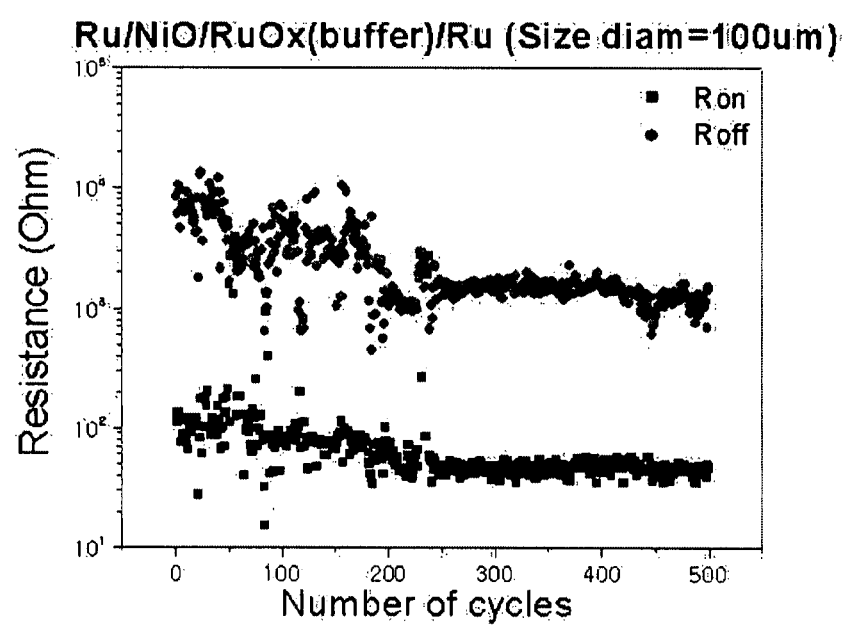

FIGS. 4A-4C are graphical representations illustrating the operating characteristics of the variable resistance memory device in which Ru oxide may be formed on a Ru lower electrode (about 20 nm) to form a buffer layer (about 20 nm), and a NiO oxide layer (about 50 nm) and a Ru upper electrode (about 20 nm) may be formed on the buffer layer. FIG. 4A illustrates threshold voltages when about 500 cycles of a switching operation may be performed. When about 250 or less cycles of the switching operation are performed, a set voltage may be more or less constant when the number of cycles is about 200 or more, and a reset voltage may be about 0.5 V, which remains constant. FIG. 4B illustrates set currents and reset currents when the number of cycles in the switching operation is about 500. As the number of cycles in the switching operation is increased, the reset current may be gradually increased, but may be kept constant at about 10 mA, which is reduced compared to about 50 mA of reset current in the conventional switching device. FIG. 4C is a graphical representation illustrating resistances in an "on" state and an "off" state when the number of cycles in the switching operation is about 500. Referring to FIG. 4C, stable resistance characteristics may be displayed as the number of cycles in the switching operation is increased. Although not shown in the drawings, relatively stable characteristics may be displayed for about 1000 switching operations. The reset current may be decreased, and the stability of the switching operation may be improved compared to those of the conventional variable resistance memory device shown in FIG. 1B.

Figure 5A:
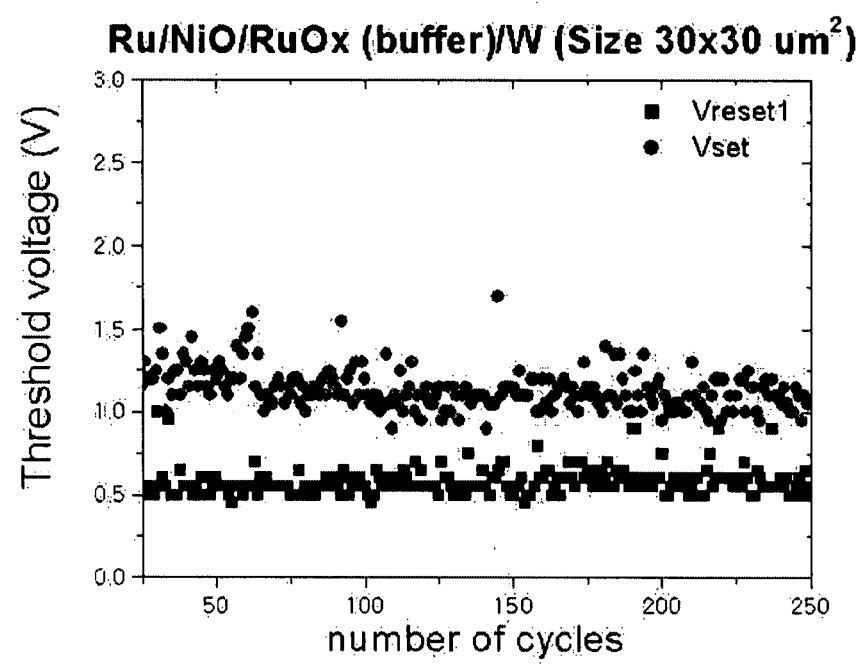
FIG. 5A is a plot illustrating threshold voltages in a variable resistance memory device having a buffer layer formed on a W lower electrode in accordance with switching cycles according to example embodiments.
Figure 5B:
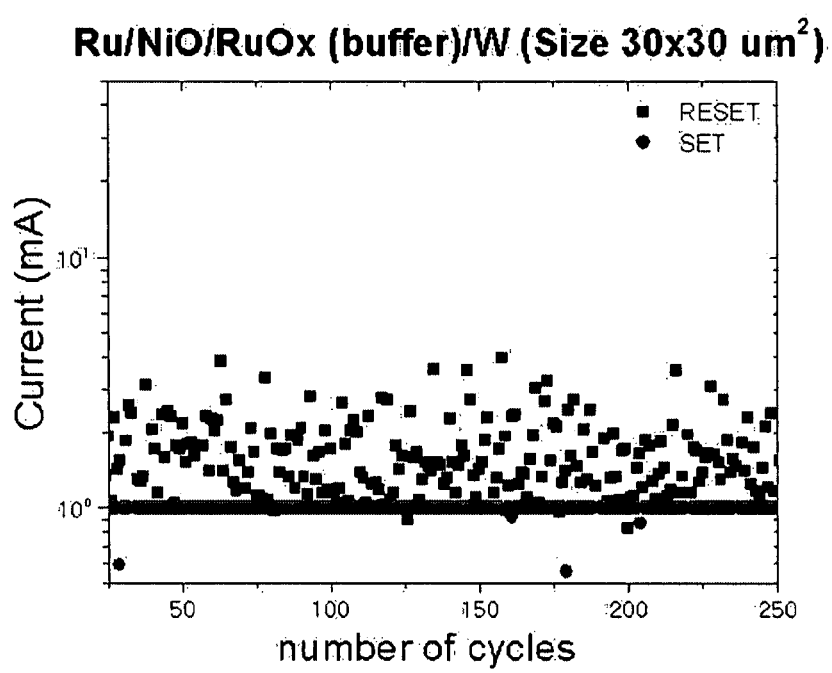
Figure 5C:
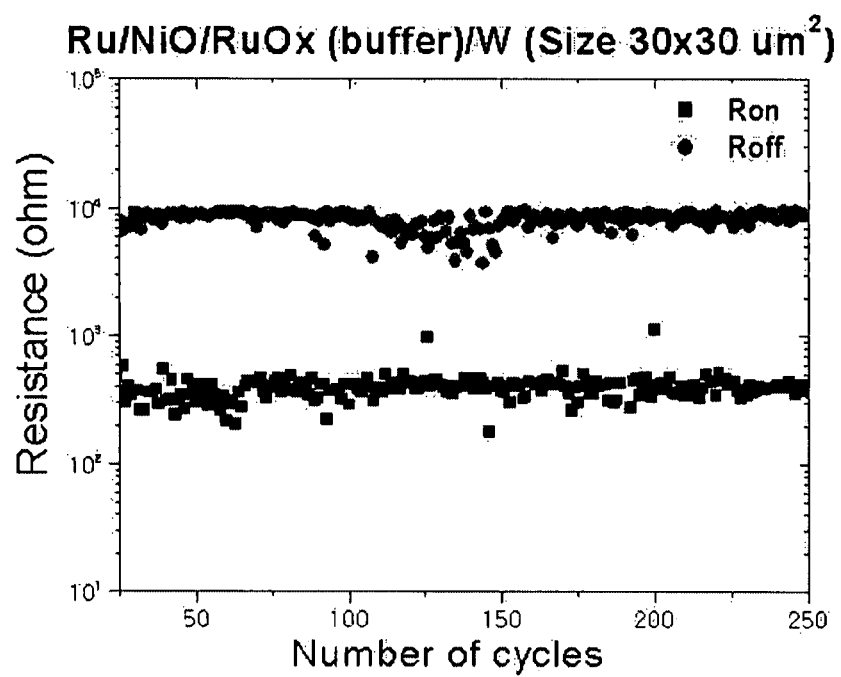

FIGS. 5A-5C are graphical representations illustrating the operating characteristics of a variable resistance memory device, in which Ru oxide may be formed on a W lower electrode (about 20 nm) to form a buffer layer (about 20 nm), and a NiO oxide layer (about 50 nm) and a Ru upper electrode (about 20 nm) may be formed on the buffer layer. FIG. 5A illustrates threshold voltages when the number of cycles in the switching operation may be about 250, and a set voltage may remain more or less constant depending on the number of switching operations, and a reset voltage may also be kept constant. FIG. 5B is a graphical representation illustrating set currents and reset currents when the number of repeated cycles in the switching operation may be about 250. Referring to FIG. 5B, reset currents generally fall within a range of about 1 mA to about 3 mA regardless of the number of cycles in the switching operation. The reset current of the switching device may decrease compared to the about 50 mA reset current in the conventional switching device. FIG. 5C is a graphical representation illustrating resistances in an "on" state and an "off" state when the number of cycles in the switching operation may be about 250. Referring to FIG. 5C, the resistances of the "on" state and the "off" state may illustrate relatively stable characteristics regardless of the number of cycles in the switching operation.

According to example embodiments, the non-volatile variable resistance memory device may have relatively stable switching characteristics and a relatively simple structure, and because the non-volatile variable resistance memory device is a cross-point type memory device, relatively high integration. The non-volatile variable resistance memory device may provide relatively stable operating characteristics by forming a buffer layer between an upper electrode and a memory node.

While example embodiments have been particularly shown and described with reference to example embodiments thereof, it will be understood by those of ordinary skill in the art that various changes in form and details may be made therein without departing from the spirit and scope of the following claims.

What is claimed is:

1. A non-volatile variable resistance memory device comprising: a lower electrode; a buffer layer formed directly on the lower electrode; an oxide layer on the buffer layer; and an upper electrode on the oxide layer, wherein the buffer layer is composed of Mn oxide, the work function of the buffer layer being higher than that of the lower electrode, and wherein the oxide layer is composed of Ni oxide or Cu oxide.

2. The non-volatile variable resistance memory device of claim 1, wherein a work function of the upper electrode is higher than that of the oxide layer.

3. The non-volatile variable resistance memory device of claim 1, wherein the lower electrode is composed of a material having a work function lower than about 5.0 eV.

4. The non-volatile variable resistance memory device of claim 3, wherein the lower electrode is composed of W, Ta, Cu, Hf, Mo, Sr, Ag, In or Cr.

5. The non-volatile variable resistance memory device of claim 1, wherein the buffer layer is composed of a material having a work function higher than about 5.0 eV.

6. The non-volatile variable resistance memory device of claim 1, wherein the upper electrode is composed of a material selected from Ru, Rh, Co, Pd, Ni, Re, Pt, Ru—Ta alloy, Pt—Hf alloy, Pt—Ti alloy, Co—Ni alloy, Ni—Ta alloy or an alloy of these materials.

7. A method of fabricating a non-volatile variable resistance memory device comprising: forming a buffer layer on a lower electrode; forming an oxide layer on the buffer layer; and forming an upper electrode on the oxide layer, wherein forming the buffer layer includes forming the buffer layer composed of Mn oxide, the work function of the buffer layer being higher than that of the lower electrode, and wherein forming the oxide layer includes forming Ni oxide.

8. The method of claim 7, wherein forming the upper electrode includes forming the upper electrode with a work function higher than that of the oxide layer.

9. The method of claim 7, wherein forming the lower electrode includes forming a material having a work function lower than about 5.0 eV.

10. The method of claim 9, wherein forming the lower electrode includes forming the lower electrode of W, Ta, Cu, Hf, Mo, Sr, Ag, In or Cr.

11. The method of claim 7, wherein forming the buffer layer includes forming a material having a work function higher than about 5.0 eV.

12. The method of claim 7, wherein forming the upper electrode includes forming a material selected from Ru, Rh, Co, Pd, Ni, Re, Pt, Ru—Ta alloy, Pt—Hf alloy, Pt—Ti alloy, Co—Ni alloy, Ni—Ta alloy or an alloy of these materials.

* * * * *